United States Patent
Habu et al.

(10) Patent No.: US 8,067,943 B2
(45) Date of Patent: Nov. 29, 2011

(54) TEST APPARATUS, CALIBRATION METHOD, PROGRAM, AND RECORDING MEDIUM

(75) Inventors: Masahiro Habu, Tokyo (JP); Yasuo Matsubara, Tokyo (JP)

(73) Assignee: Advantest Corporation, Tokyo (JP)

( * ) Notice: Subject to any disclaimer, the term of this patent is extended or adjusted under 35 U.S.C. 154(b) by 309 days.

(21) Appl. No.: 12/409,512

(22) Filed: Mar. 24, 2009

(65) Prior Publication Data
US 2010/0244852 A1    Sep. 30, 2010

(51) Int. Cl.
*G01R 31/02* (2006.01)
(52) U.S. Cl. .................................. 324/537; 324/762.01
(58) Field of Classification Search .................. None
See application file for complete search history.

(56) References Cited

U.S. PATENT DOCUMENTS

| | | | | |
|---|---|---|---|---|
| 6,020,752 | A * | 2/2000 | Shimasaki | 324/756.04 |
| 6,417,682 | B1 * | 7/2002 | Suzuki et al. | 324/537 |
| 7,013,230 | B2 * | 3/2006 | Sekino | 324/750.3 |
| 7,532,994 | B2 * | 5/2009 | Tada et al. | 702/117 |
| 7,876,120 | B2 * | 1/2011 | Awaji et al. | 324/750.3 |
| 2004/0145375 | A1 * | 7/2004 | Sekino | 324/600 |
| 2010/0049453 | A1 * | 2/2010 | Watanabe et al. | 324/537 |
| 2010/0176835 | A1 * | 7/2010 | Sasajima | 324/763 |
| 2011/0012612 | A1 * | 1/2011 | Iwamoto | 324/537 |

FOREIGN PATENT DOCUMENTS

| | | | |
|---|---|---|---|
| JP | 2000-199781 | | 7/2000 |
| JP | 2004-264046 | | 9/2004 |
| JP | 2008107188 A | * | 5/2008 |
| WO | 2008/050607 | | 5/2008 |

OTHER PUBLICATIONS

"PCT Search Report" issued on Apr. 27, 2010, p. 1-p. 6.

* cited by examiner

*Primary Examiner* — Jermele M Hollington
(74) *Attorney, Agent, or Firm* — Jianq Chyun IP Office

(57) ABSTRACT

Provided is a test apparatus, a calibration method, a program causing a computer to perform as a test apparatus, and a recording medium storing the program. The test apparatus includes a response characteristic detecting section that detects a difference between a response time of the comparator for a rising waveform and a response time of the comparator for a falling waveform, based on measurement results, obtained by the comparator, of the waveforms and corresponding reflected waveforms, The response characteristic detecting section calculates a difference between output characteristics of the rising waveform and the falling waveform output from the driver, based on the measurement results from the comparator of the waveforms and the corresponding reflected waveforms, and corrects a difference between the response times of the comparator based on the difference between the output characteristics.

9 Claims, 9 Drawing Sheets

TEST APPARATUS, CALIBRATION METHOD, PROGRAM, AND RECORDING MEDIUM

BACKGROUND

1. Technical Field

The present invention relates to a test apparatus, a calibration method, a program, and a recording medium.

2. Related Art

A test apparatus that tests a semiconductor device is provided with a comparator that receives the output signal from the device under test within the test apparatus. The comparator sometimes has a different response time for when a rising waveform is input than for when a falling waveform is input. If there is a different response time for a rising waveform than for a falling waveform, an error arises in the measurement timing of the output signal from the device under test. As a result, the test apparatus cannot accurately test the device under test.

SUMMARY

Therefore, it is an object of an aspect of the innovations herein to provide a test apparatus, a calibration method, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a driver that outputs a signal to a transmission line that is to be connected to the device under test; a comparator that compares a level of the signal transmitted on the transmission line to a set reference level; a judging section that judges acceptability of the device under test based on a measurement result, obtained by the comparator, of a response signal from the device under test; and a response characteristic detecting section that, with an end of the transmission line on the device under test side connected to a prescribed potential, sequentially outputs a rising waveform and a falling waveform from the driver, and that detects a difference between a response time of the comparator for the rising waveform and a response time of the comparator for the falling waveform, based on measurement results, obtained by the comparator, of the waveforms and corresponding reflected waveforms. The response characteristic detecting section calculates a difference between output characteristics of the rising waveform and the falling waveform output from the driver, based on the measurement results from the comparator of the waveforms and the corresponding reflected waveforms, and corrects a difference between the response times of the comparator based on the difference between the output characteristics.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
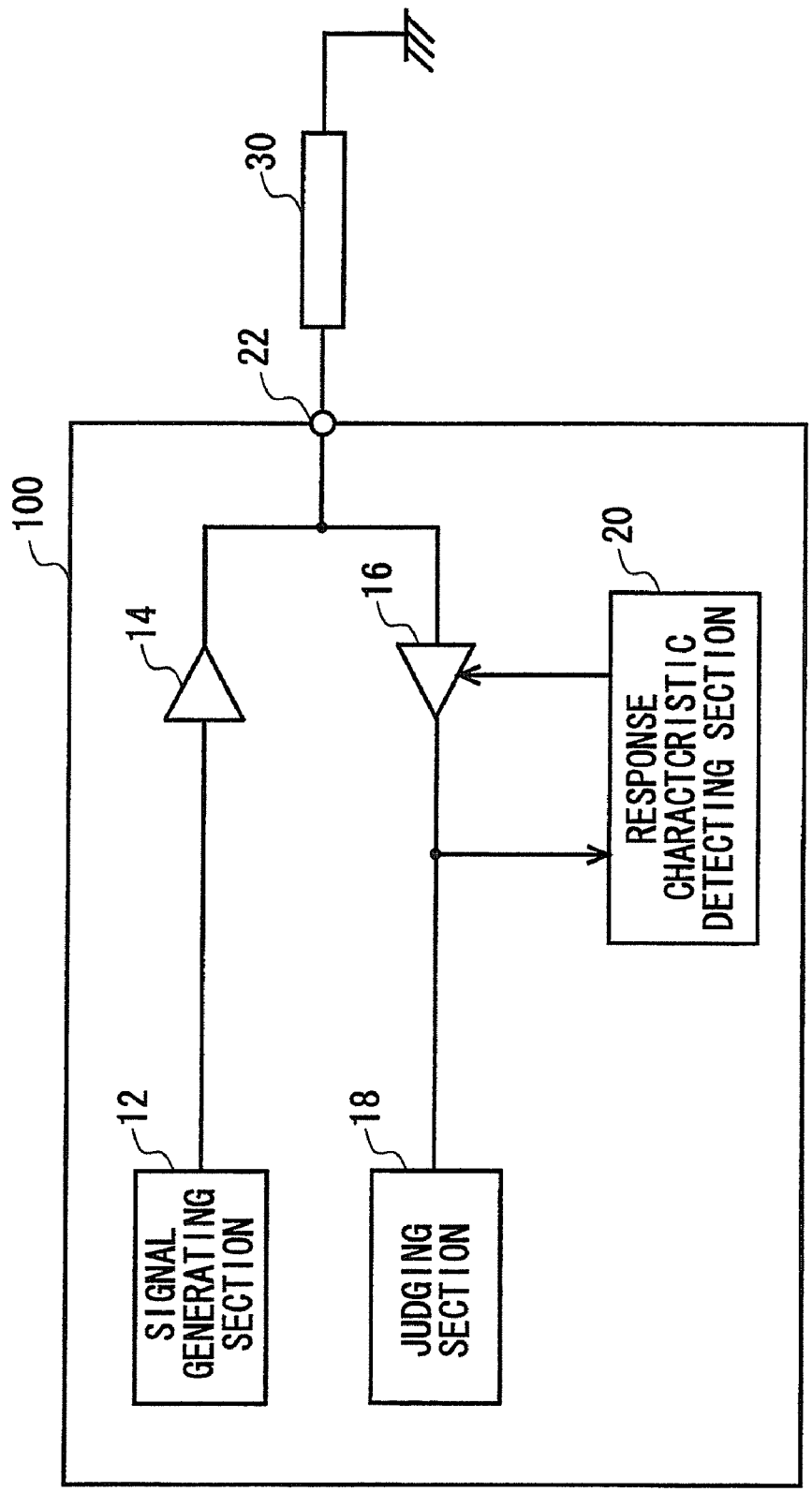
FIG. 1 shows a configuration of a test apparatus 100 according to an embodiment of the present invention.

FIG. 1 shows a configuration of a test apparatus 100 according to an embodiment of the present invention. The test apparatus 100 is provided with a signal generating section 12, a driver 14, a comparator 16, a judging section 18, and a response characteristic detecting section 20. A signal terminal 22 of the test apparatus 100 is connected to one end of a transmission line 30. The far end of the transmission line 30 relative to the test apparatus 100 is connected to a device under test when testing the device under test, and is connected to a prescribed potential when measuring a response time of the comparator 16.

First, the operation of the test apparatus 100 when testing the device under test, such as a semiconductor device, is described. During testing of the device under test, the transmission line 30 connects the device under test between the driver 14 and the comparator 16. The transmission line 30 may have a characteristic impedance of 50 Ω and include a print substrate, a coaxial cable, a coaxial connector, and the like.

The signal generating section 12 generates a test signal to be input to the device under test. The test signal may be a signal having a prescribed logic pattern, a clock signal, or the like. The signal generating section 12 may further generate a strobe signal used for the timing judgment of the comparator 16.

The driver 14 outputs a signal to the transmission line 30 connected to the device under test. For example, the driver 14 receives the test signal generated by the signal generating section 12 and supplies the device under test, via the signal terminal 22, with an output signal converted to have a prescribed high level voltage or low level voltage.

The comparator 16 is connected to the driver 14 and to the signal terminal 22 connected to the transmission line 30. The comparator 16 receives, via the transmission line 30, a response signal output by the device under test in response to the test signal. The comparator 16 compares the level of the signal sent from the transmission line 30 to a set reference level.

The comparator 16 may include an analog comparator and a timing comparator. The analog comparator receives an analog signal and converts the analog signal into a signal having two logic values, i.e. high and low, based on a prescribed level threshold value. The timing comparator receives the logic signal and measures the logic value of this signal at timings based on the strobe signal generated by the signal generating section 12. The comparator 16 outputs the measurement result to the judging section 18.

The judging section 18 judges the acceptability of the device under test based on the measurement result obtained by the comparator 16 of the response signal output by the device under test. The judging section 18 may judge the acceptability of the device under test by comparing the measurement result of the logic signal to an expected value corresponding to the test signal output by the signal generating section 12. Next, the operation performed by the test apparatus 100 when measuring the response time of the comparator 16 will be described.

Figure 2:
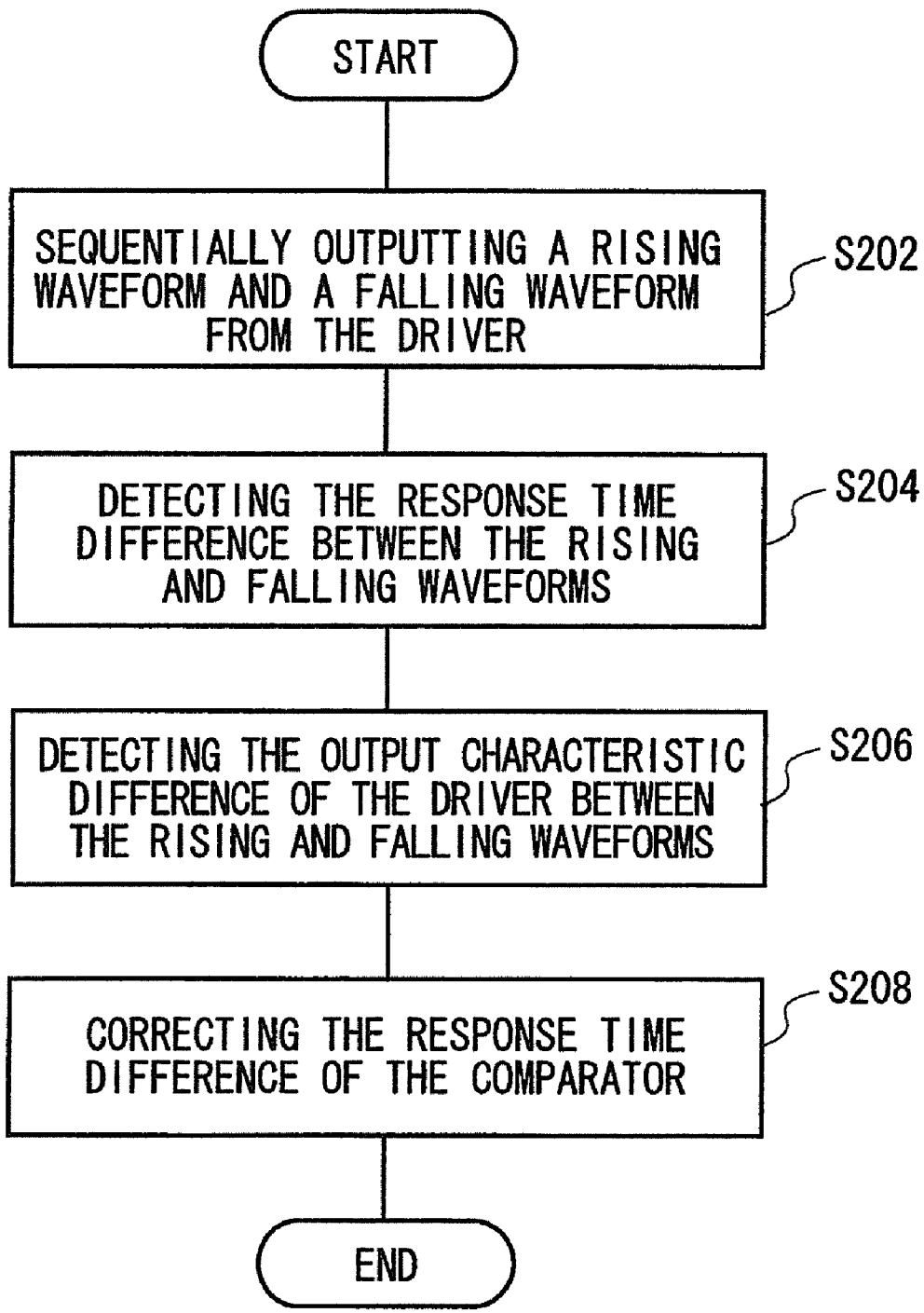
FIG. 2 is a flow chart showing an exemplary operation of the test apparatus 100.

FIG. 2 is a flow chart showing an exemplary operation of the test apparatus 100. With the end of the transmission line 30 on the device under test side connected to a prescribed potential, the response characteristic detecting section 20 sequentially outputs a rising waveform and a falling waveform from the driver (S202). The response characteristic detecting section 20 detects the difference between the response time of the comparator 16 for a rising waveform and the response time of the comparator 16 for a falling waveform, based on the measurement result of each waveform and corresponding reflected waveform (S204). The end of the transmission line 30 on the device under test side may be grounded.

Furthermore, the response characteristic detecting section 20 calculates the difference between (i) an output characteristic of a rising waveform from the driver 14 and (ii) an output characteristic of a falling waveform from the driver 14, based on the measurement result of the each waveform and each reflected waveform by the comparator 16 (S206). The response characteristic detecting section 20 corrects the difference between the response times of the comparator 16 based on the difference in the output characteristics (S208).

Figure 3:
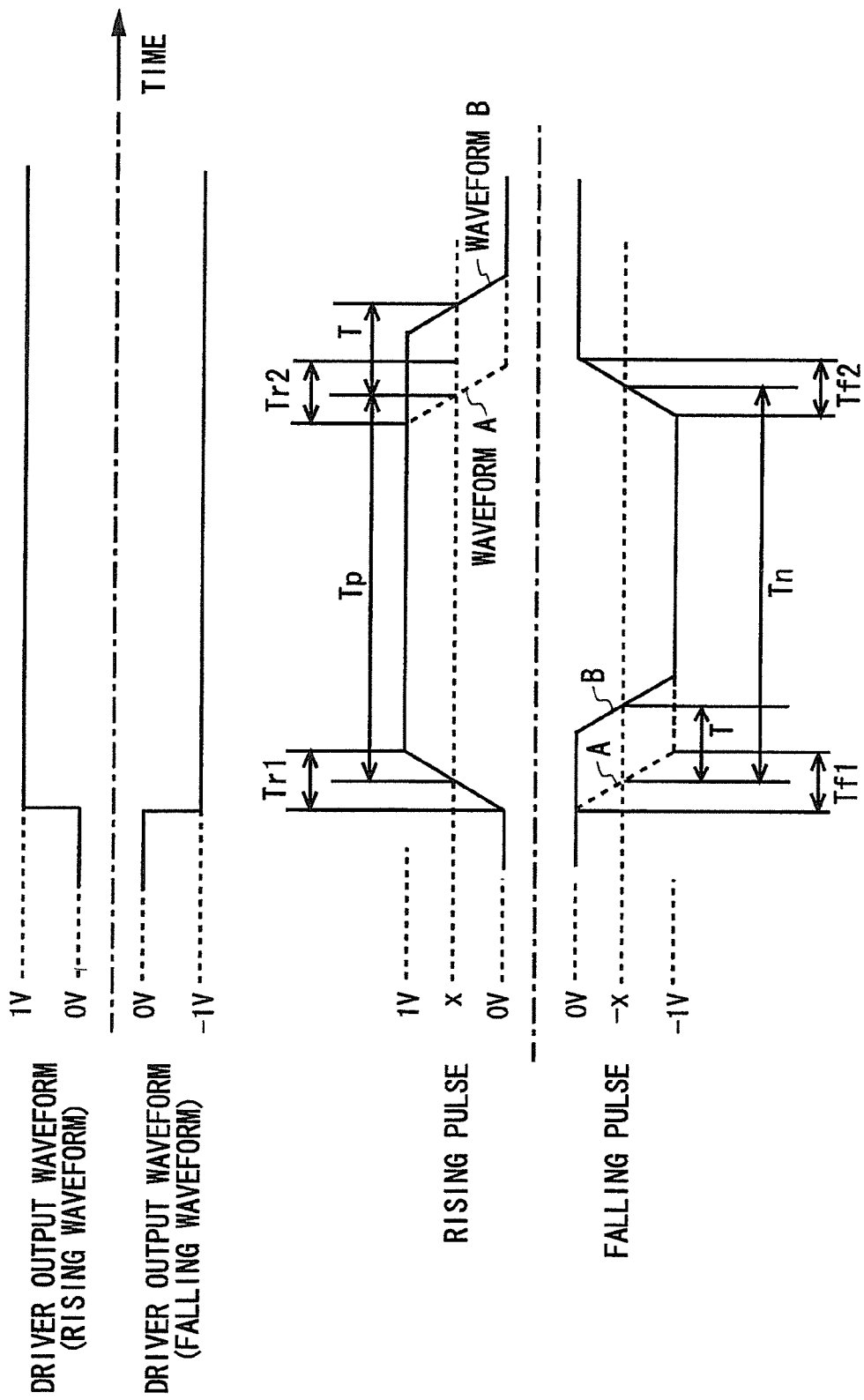
FIG. 3 shows an input waveform input to the comparator 16 and a response waveform from the comparator 16, resulting from a waveform output by the driver 14.

FIG. 3 shows an input waveform A input to the comparator 16 and a response waveform B from the comparator 16, resulting from a waveform output by the driver 14. When the driver 14 outputs a rising waveform, the voltage indicated by the waveform for the comparator 16 rises from a low voltage level, which is 0 V in the present embodiment, to a high voltage level, which is 1 V in the present embodiment. Afterwards, the output wave of the driver 14 is reflected at the end of the transmission line 30 on the device under test side, such that the output wave is combined with the reflected wave.

As a result, the waveform input to the comparator 16 becomes a pulse that rises from 0 V to 1 V and then falls from 1 V to 0 V after a prescribed amount of time has passed. Hereinafter, such a pulse is referred to as a rising pulse. The rising waveform of the rising pulse corresponds to the output wave of the driver 14. The falling waveform of the rising pulse corresponds to the reflected wave.

When the driver 14 outputs a falling waveform, the voltage indicated by the waveform input to the comparator 16 falls from 0 V to −1 V. Afterwards, the output wave of the driver 14 is reflected at the end of the transmission line 30 on the device under test side, such that the output wave is combined with the reflected wave. As a result, the waveform input to the comparator 16 becomes a pulse that falls from 0 V to −1 V and then rises from −1 V to 0 V after a prescribed amount of time has passed. Hereinafter, such a pulse is referred to as a falling pulse. The falling waveform of the falling pulse corresponds to the output wave of the driver 14. The rising waveform of the falling pulse corresponds to the reflected wave.

When the transmission delay time of the transmission line 30 is expressed as Ta, the time from the rising waveform to the falling waveform in the rising pulse is double the transmission delay time of the transmission line 30. As a result, the pulse width Tp of the rising pulse is equal to Ta×2. In the same way, the time from the falling waveform to the rising waveform in the falling pulse is double the transmission delay time of the transmission line 30. As a result, the pulse width Tn of the falling pulse is equal to Ta×2.

As an example, the pulse width of the rising pulse may be the time difference between (i) the timing at which the voltage of the rising waveform becomes a reference level x and (ii) the timing at which the voltage of the falling waveform becomes the reference level x. The pulse width of the falling pulse may be the time difference between (i) the timing at which the voltage of the falling waveform becomes a reference level −x and (ii) the timing at which the voltage of the rising waveform becomes the reference level −x.

In FIG. 3, the rising pulse and the falling pulse input to the comparator 16 have the same pulse width, as shown by waveform A. However, when the response time of the comparator 16 for the rising waveform is different from the response time for the falling waveform, the comparator 16 responds with a rising pulse width and a falling pulse that have different lengths. For example, as shown by waveform B in FIG. 3, when the response time of the comparator 16 for the falling waveform is longer by T than the response time of the comparator 16 for the rising waveform, the rising pulse width becomes Tp+T and the falling pulse width becomes Tn−T.

Therefore, upon detecting that the comparator 16 responds with a rising pulse width and a falling pulse that have different lengths, the response characteristic detecting section 20 adjusts the comparator 16 such that the pulse widths become equal to each other. For example, the response characteristic detecting section 20 can adjust the comparator 16 to delay the rising response time by T, so that the response time of the comparator 16 for the rising waveform is the same as the response time for the falling waveform.

Figure 4:
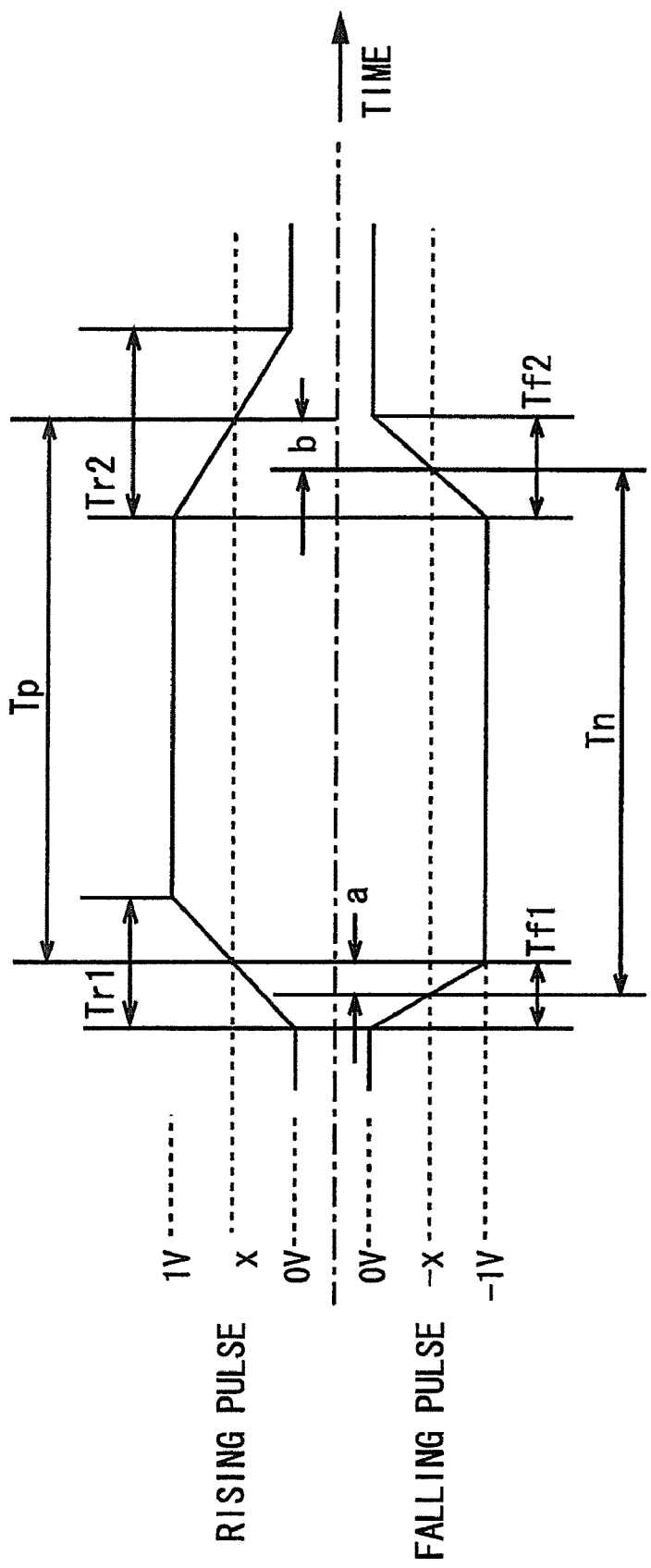
FIG. 4 shows the waveform input to the comparator 16 when the output characteristics of the driver 14 are different for the rising waveform than for the falling waveform.

FIG. 4 shows the waveform input to the comparator 16 when the output characteristics of the driver 14 are different for the rising waveform than for the falling waveform. When the output characteristic of the rising waveform is different from the output characteristic of the falling waveform, the rising time Tr1 of the rising pulse and the falling time Tf1 of the falling pulse are different. The falling time Tr2 of the rising pulse and the rising time Tf2 of the falling pulse are also different.

As a result, a time difference "a" occurs between (i) the timing at which the voltage of the rising waveform in the rising pulse becomes equal to the reference level x and (ii) the timing at which the voltage of the falling waveform in the falling pulse becomes equal to the reference level −x. In the same way, a time difference "b" occurs between (i) the timing at which the voltage of the falling waveform in the rising pulse becomes equal to the reference level x and (ii) the timing at which the voltage of the rising waveform in the falling pulse becomes equal to the reference level −x.

The time difference "a" and the time difference "b" also occur in the response waveforms output by the comparator 16. Therefore, the response characteristic detecting section 20 corrects the pulse widths based on the time difference "a" and the time difference "b," such that the rising pulse width and the falling pulse width become equal to each other.

If the rising time or the falling time of a reflected waveform is longer than the rising time or the falling time of the output waveform of the driver 14, then Tr2 is longer than Tr1 and Tf2 is longer than Tf1. For example, since the reflected waveform is transmitted on a relatively long signal path, waveform rounding increases and the rising time and falling time are both lengthened. In this case, the time difference "b" is greater than the time difference "a." Therefore, the response characteristic detecting section 20 may shorten the rising pulse width by an amount of time corresponding to a correction value Z=b−a.

The output characteristics of the driver 14 may be different depending on the driver 14. Accordingly, if the test apparatus 100 includes a plurality of drivers 14, comparators 16, and response characteristic detecting sections 20, an error occurs in the correction when the same correction value is used for all of the drivers 14 and comparators 16. Therefore, a correction value is desirably calculated for each driver 14 according to the output characteristic of the driver 14. The following describes a method by which the response characteristic detecting section 20 calculates the correction value.

Figure 5:
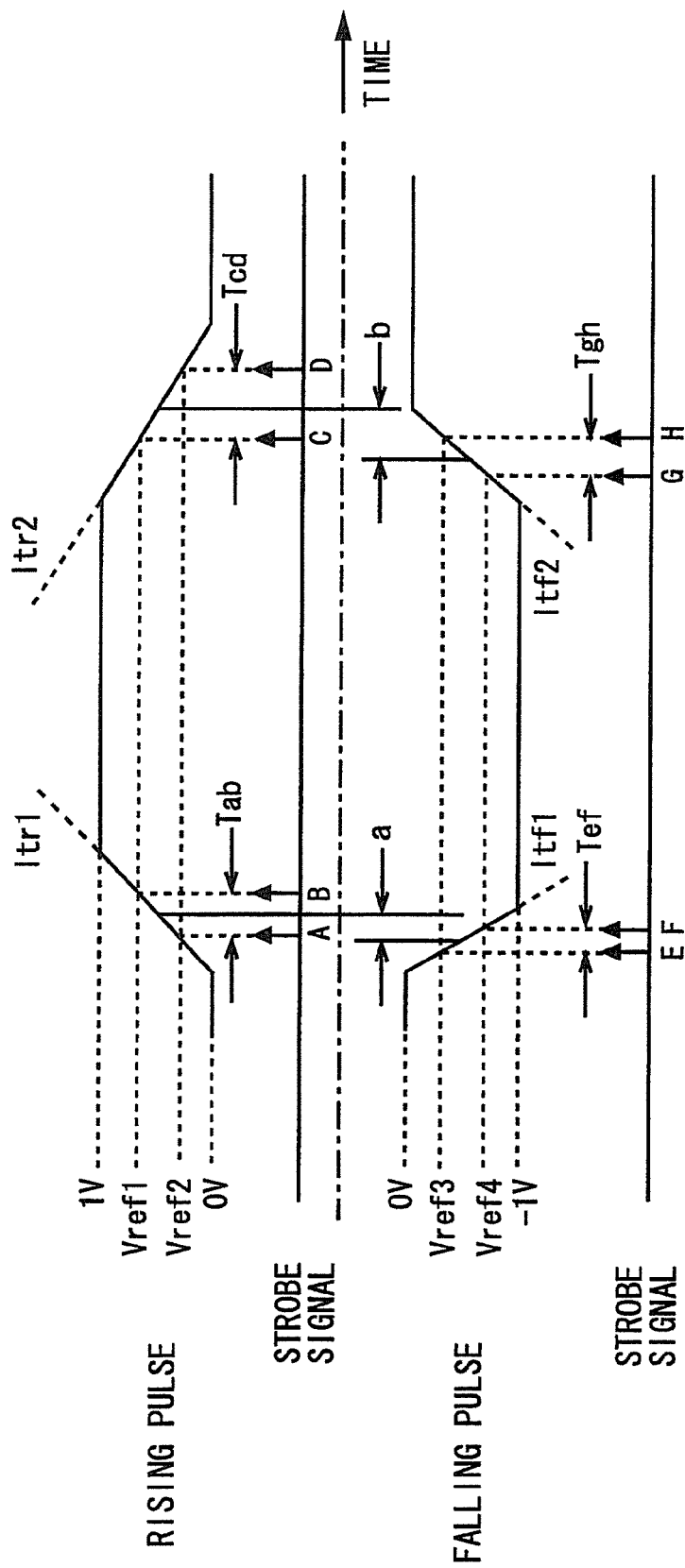
FIG. 5 shows a method for calculating the correction value according to the output characteristic of the driver 14.

FIG. 5 shows a method for calculating the correction value according to the output characteristic of the driver 14. When the test apparatus 100 corrects the difference between response times, the driver 14 sequentially outputs rising waveforms and falling waveforms.

The response characteristic detecting section 20 measures a first measurement time, which is the time from when the comparator 16 measures the rising waveform to when the comparator 16 measures the reflected rising waveform. The response characteristic detecting section 20 also measures a second measurement time, which is the time from when the comparator 16 measures the falling waveform to when the comparator 16 measures the reflected falling waveform. Next, the response characteristic detecting section 20 detects the difference between the response time of the comparator 16 for the rising waveform and the response time of the comparator 16 for the falling waveform, based on the first measurement time and the second measurement time. The response characteristic detecting section 20 then corrects the difference between the response times based on the slopes of the waveforms and reflected waveforms input to the comparator 16.

More specifically, the response characteristic detecting section 20 corrects the difference between the response times using the following operation. First, the response characteristic detecting section 20 sequentially sets at least two reference levels in the comparator 16 for each waveform and reflected waveform output by the driver 14.

For example, as shown in FIG. 4, the response characteristic detecting section 20 may set, for the rising pulse, a reference level Vref1 near a high voltage level, which is 1 V in the present embodiment, and a reference level Vref2 near a low voltage level, which is 0 V in the present embodiment. The response characteristic detecting section 20 may further set, for the falling pulse, a reference level Vref3 near a high voltage level, which is 0 V in the present embodiment, and a reference level Vref4 near a low voltage level, which is −1 V in the present embodiment.

The response characteristic detecting section 20 measures the time at which the voltage of the rising waveform in the rising pulse becomes equal to the reference level Vref1, and the time at which this voltage becomes equal to the reference level Vref2. For example, the response characteristic detecting section 20 first sets the reference level Vref2 as a threshold value for the comparator 16. The response characteristic detecting section 20 then detects a strobe signal A having a timing at which the value of the logic signal output by the comparator 16 becomes equal to the expected value.

Next, the response characteristic detecting section 20 sets the reference level Vref1 as a threshold value for the comparator 16, and then detects a strobe signal B having a timing at which the value of the logic signal output by the comparator 16 becomes equal to the expected value. The response characteristic detecting section 20 calculates the time difference Tab between the strobe signal A and the strobe signal B.

The response characteristic detecting section 20 measures the time at which the voltage of the falling waveform in the rising pulse becomes equal to the reference level Vref1, and the time at which this voltage becomes equal to the reference level Vref2. For example, the response characteristic detecting section 20 first sets the reference level Vref1 as a threshold value for the comparator 16. The response characteristic detecting section 20 then detects a strobe signal C having a timing at which the value of the logic signal output by the comparator 16 becomes different from the expected value.

Next, the response characteristic detecting section 20 sets the reference level Vref2 as a threshold value for the comparator 16, and then detects a strobe signal D having a timing at which the value of the logic signal output by the comparator 16 becomes different from the expected value. The response characteristic detecting section 20 calculates the time difference Tcd between the strobe signal C and the strobe signal D.

The response characteristic detecting section 20 performs the same measurement of the falling pulse. More specifically, the response characteristic detecting section 20 sets a reference level Vref3 and a reference level Vref4 as the threshold value for the comparator 16, and detects a strobe signal E and a strobe signal F having timings at which the values of the logic signals output by the comparator 16 become equal to the expected value.

The response characteristic detecting section 20 also sets the reference level Vref3 and the reference level Vref4 as the threshold value for the comparator 16, and detects a strobe signal G and a strobe signal H having timings at which the values of the logic signals output by the comparator 16 become different from the expected value. The response characteristic detecting section 20 measures a time difference Tef for the falling waveform and measures a time difference Tgh for the rising waveform.

Next, the response characteristic detecting section 20 calculates the slopes of the waveforms and the reflected waveforms input to the comparator 16, based on the measurement results from the comparator 16. More specifically, the response characteristic detecting section 20 calculates the slopes of the waveforms by dividing the voltage difference relative to the reference level by the time difference between the measured strobe signals. For example, the response characteristic detecting section 20 may calculate the slope of the rising waveform in the rising pulse to be $Itr1=(Vref1-Vref2)/Tab$. The response characteristic detecting section 20 may calculate the slope of the falling waveform in the rising pulse to be $Itr2=(Vref2-Vref1)/Tcd$.

In the same way, the response characteristic detecting section 20 may calculate the slope of the falling waveform in the falling pulse to be $Itf1=(Vref4-Vref3)/Tef$, and may calculate the slope of the rising waveform in the falling pulse to be $Itf2=(Vref3-Vref4)/Tgh$.

The response characteristic detecting section 20 calculates the time difference "a" and the time difference "b" based on the slopes of the rising waveforms and falling waveforms in the rising pulse and the falling pulse. More specifically, when the reference level for measuring the rising pulse width is x and the reference level for measuring the falling pulse width is −x, the response characteristic detecting section 20 may calculate "a" to be equal to x/Itr1−(−x)/Itf1. The response characteristic detecting section 20 may calculate "b" to be equal to (x−1)/Itr2−(−x+1)/Itf2. Based on these calculated values, the response characteristic detecting section 20 uses the correction value Z=b−a to correct the rising pulse width and falling pulse width of the comparator 16.

Figure 6:
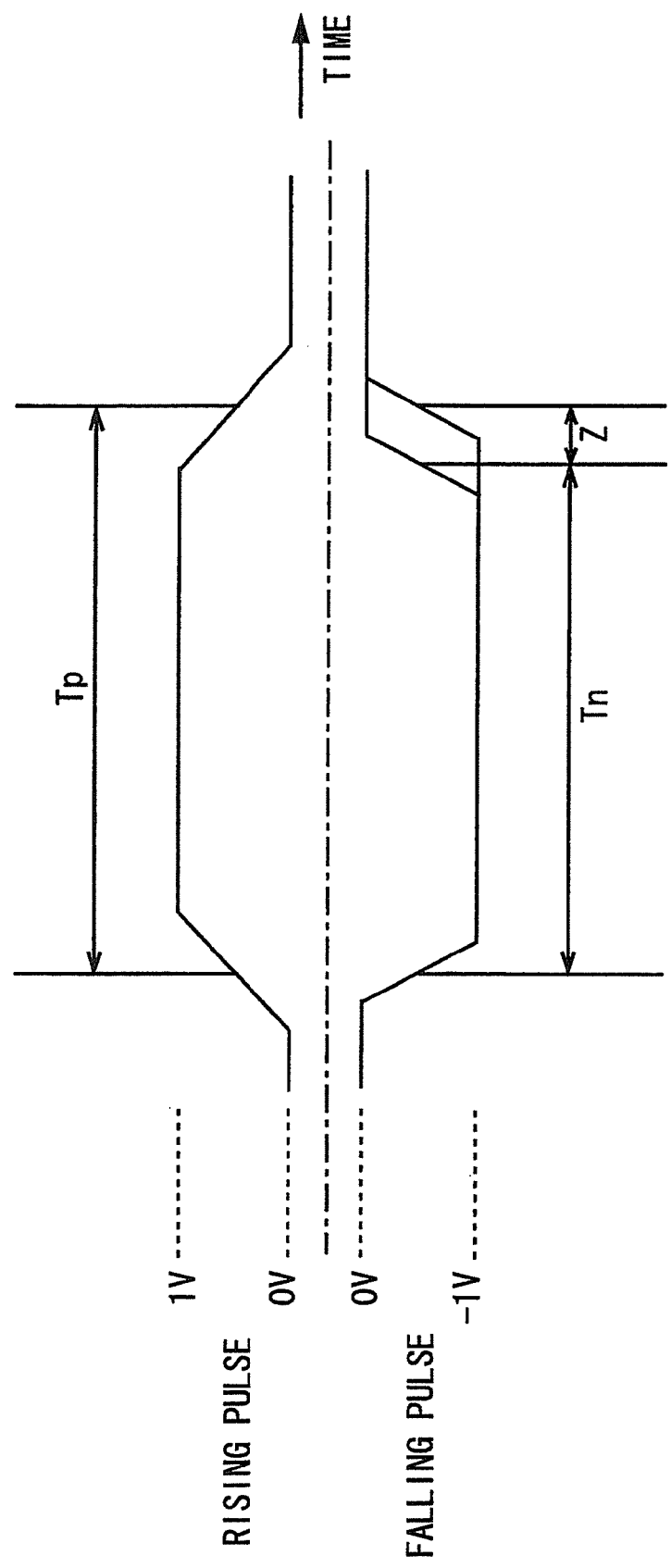
FIG. 6 shows a method for performing the correction according to the output characteristics of the driver 14.

FIG. 6 shows a method for performing the correction according to the output characteristics of the driver 14. The response characteristic detecting section 20 may correct the pulse widths by adding or subtracting the correction value Z to or from the pulse width of the rising waveform or the pulse width of the falling waveform. For example, when the rising time of the waveform output from the driver 14 is longer than the falling time, the time difference "b" is greater than the time difference "a." Accordingly, the rising pulse width is greater than the falling pulse width by Z=b−a.

Therefore, the comparator 16 may cause the rising pulse width to be equal to the falling pulse width by performing a correction that involves increasing the falling pulse width by Z=b−a. For example, the comparator 16 may generate a delayed signal by selectively delaying the rising waveform of the rising pulse by Z. At this time, the falling waveform of the falling pulse is not delayed.

In the same way, when the falling time of the waveform output from the driver 14 is longer than the rising time, the time difference "b" is less than the time difference "a." Accordingly, the rising pulse width is less than the falling pulse width by Z=b−a. Therefore, the comparator 16 may cause the rising pulse width to be equal to the falling pulse width by performing a correction that involves increasing the rising pulse width by Z=b−a.

Instead, the response characteristic detecting section 20 may cause the rising pulse width to be equal to the falling pulse width by decreasing the rising pulse width or the falling pulse width by Z=b−a. For example, when the time difference "b" is greater than the time difference "a," the comparator 16 may generate a delayed signal by delaying the rising timing of the rising pulse by Z. By performing the above corrections, the rising response characteristic and the falling response characteristic of the comparator 16 can be made substantially equal, regardless of the output characteristics of the driver 14.

In order to increase the accuracy of the correction, the response characteristic detecting section 20 may set the reference levels used when calculating the slopes to be voltages at the ends of a region in which the slopes of the rising waveform and the falling waveform are linear. For example, the response characteristic detecting section 20 may set the reference level Vref1 to be a voltage corresponding to substantially 80% of the difference between the high level voltage and the low level voltage. The response characteristic detecting section 20 may set the reference level Vref2 to be a voltage corresponding to substantially 20% of the difference between the high level voltage and the low level voltage.

Figure 7:
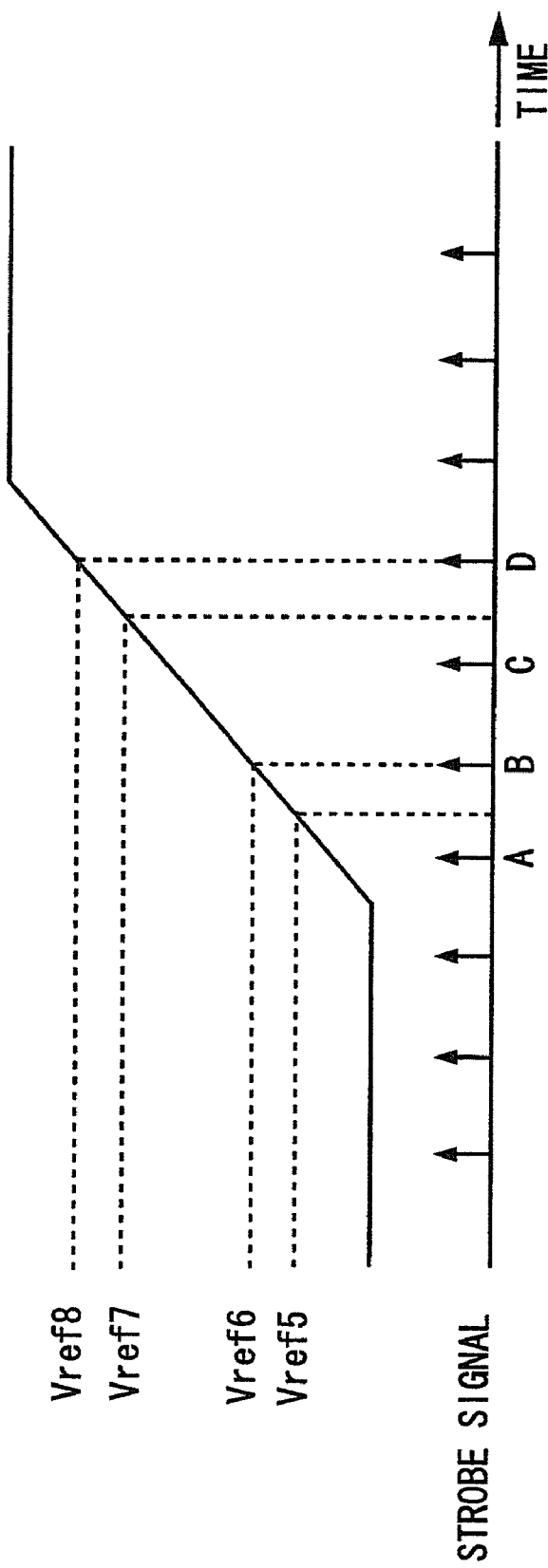
FIG. 7 shows a method for calculating the slope, according to another embodiment of the present invention.

FIG. 7 shows a method for calculating the slope, according to another embodiment of the present invention. The waveform in FIG. 7 shows a region around the rising waveform of the rising pulse. The comparator 16 compares the level of the waveform input into the comparator 16 to the reference level, at timings of a strobe signal having a prescribed period. The response characteristic detecting section 20 adjusts the reference level such that the timing at which the level of the waveform input to the comparator 16 matches the reference level becomes substantially the same as the timing of the strobe signal.

More specifically, while sequentially changing the reference level at prescribed voltage intervals, the response characteristic detecting section 20 observes whether the output value of the comparator 16 matches the expected value at the timing of each strobe signal. When the output value of the comparator 16 changes to match the expected value or changes to be different from the expected value at a certain timing of the strobe signal, the response characteristic detecting section 20 stores the signal level at this timing in association with the strobe signal.

While changing the reference level, the response characteristic detecting section 20 continues to observe whether the output value of the comparator 16 matches the expected value at each timing of the strobe signal. If the output value of the comparator 16 changes to match the expected value or changes to be different from the expected value at another timing of the strobe signal, the response characteristic detecting section 20 stores the signal level at this timing in association with the strobe signal. The response characteristic detecting section 20 can increase the accuracy of the slope calculation by calculating the slope based on the time difference of each strobe signal and the voltage difference of each reference level.

For example, in FIG. 7, when the threshold value of the comparator 16 is set to a reference level Vref5, the output value of the comparator 16 does not match the expected value at the timing of the strobe signal A. On the other hand, the output value of the comparator 16 does match the expected value at the timing of the strobe signal B. When the response characteristic detecting section 20 increases the voltage threshold value of the comparator 16 to a reference level Vref6, the output value of the comparator 16 becomes different from the expected value at the timing of the strobe signal B. The response characteristic detecting section 20 stores, in association with the reference level Vref6, the timing of the strobe signal B at which the output value of the comparator 16 became different from the expected value.

Next, when the threshold value of the comparator 16 is set to a reference level Vref7, the output value of the comparator 16 matches the expected value at the timing of the strobe signal C. On the other hand, the output value of the comparator 16 does match the expected value at the timing of the strobe signal D. When the response characteristic detecting section 20 increases the voltage threshold value of the comparator 16 to a reference level Vref8, the output value of the comparator 16 becomes equal to the expected value at the timing of the strobe signal D. The response characteristic detecting section 20 stores, in association with the reference level Vref8, the timing of the strobe signal D at which the output value of the comparator 16 becomes equal to the expected value.

The response characteristic detecting section 20 can calculate the slope of the rising waveform by dividing (i) the voltage difference between the reference level Vref6 and the reference level Vref8 by (ii) the time difference between the strobe signal B and the strobe signal D. The response characteristic detecting section 20 may use the same method to calculate the slope of the falling waveform. By performing the above corrections, the error caused by the resolution of the strobe signals is decreased, thereby increasing the accuracy of the slope calculation. As a result, the response time can be corrected more accurately.

Figure 8:
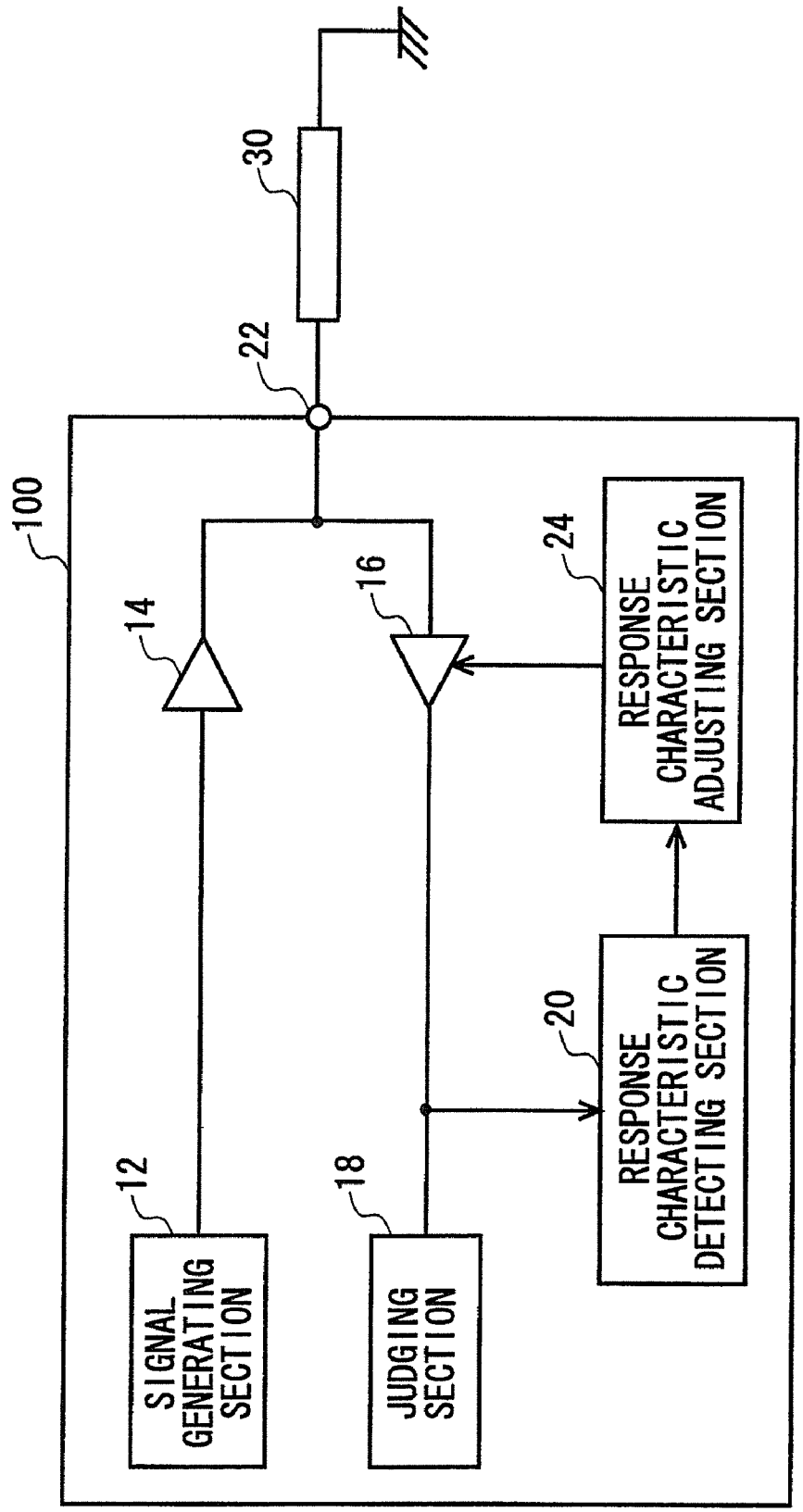
FIG. 8 shows a configuration of the test apparatus 100 according to another embodiment of the present invention.

FIG. 8 shows a configuration of the test apparatus 100 according to another embodiment of the present invention. In FIG. 8, the test apparatus 100 further includes a response characteristic adjusting section 24. The response characteristic adjusting section 24 adjusts the response characteristics of the comparator 16 based on the difference between the response times detected by the response characteristic detecting section 20. For example, when the response time of the comparator 16 is longer for the falling waveform than for the rising waveform, the response characteristic adjusting section 24 may increase the voltage threshold value at which the comparator 16 detects the rising waveform. The response characteristic adjusting section 24 may change the logic value of the measurement data of the comparator 16 according to a number of strobe signals corresponding to the difference between the response times.

The embodiments above described methods for using a voltage waveform to correct the response times. The test apparatus 100 may perform the same corrections using a current waveform instead.

Figure 9:
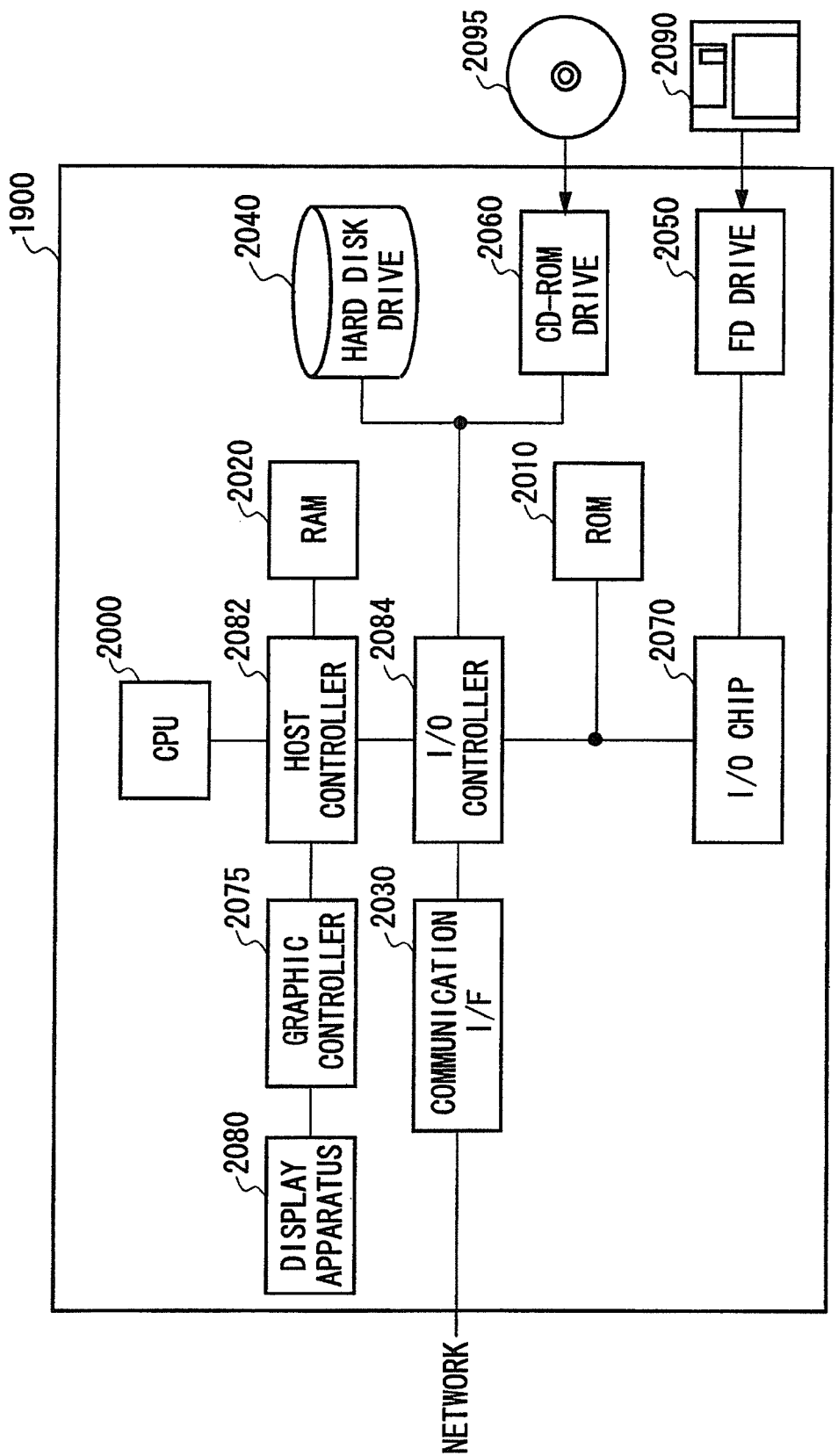
FIG. 9 shows an example of a hardware configuration of a computer 1900 serving as the test apparatus 100, according to another embodiment of the present invention.

FIG. 9 shows an example of a hardware configuration of a computer 1900 serving as the test apparatus 100, according to another embodiment of the present invention. The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a measurement interface 2032, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to the input/output controller 2084 along with each of the input/output apparatuses via, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as the test apparatus 100 cause the computer 1900 to function as a response characteristic detecting module that, with the end of the transmission line on the device under test side connected to a prescribed potential, sequentially outputs a rising waveform and a falling waveform from the driver, and then detects the difference between the response time of the comparator for the rising waveform and the response time of the comparator for the falling waveform, based on measurement results from the comparator of the waveforms and reflected waveforms. The programs then cause the response characteristic detecting module to calculate the difference between the output characteristics of the rising waveform and the falling waveform output from the driver, based on the measurement results from the comparator of the waveforms and reflected waveforms, and to correct the difference between the response times of the comparator based on the difference between the output characteristics. These programs and modules are executed by the CPU 200 or the like to cause the computer 1900 to function as the test apparatus 100.

The information processes recorded in these programs are read by the computer 1900 to cause the computer 1900 to function as software and hardware described above, which are exemplified by the specific section of the response characteristic detecting section 20. With these specific sections, a unique test apparatus 100 suitable for an intended use can be configured by realizing the calculations or computations appropriate for the intended use of the computer 1900 of the present embodiment.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the storage apparatus, such as the RAM 2020, the hard disc 2040, the flexible disk 2090, or the CD-ROM 2095, and send this transmission data to the network, and to write data received from the network onto a reception buffer area on the storage apparatus. In this way, the communication interface 2030 may transmit data to and from the storage apparatus through DMA (Direct Memory Access). As another possibility, the CPU 2000 may transmit the data by reading the data from the storage apparatus or communication interface 2030 that are the origins of the transmitted data, and writing the data onto the communication interface 2030 or the storage apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk 2040, the CD-ROM drive 2060, the CD-ROM 2095, the flexible disk drive 2050, or the flexible disk 2090. The CPU 2000 writes the processed data back to the external apparatus through DMA transmission or the like.

In this process, the RAM 2020 is considered to be a section that temporarily stores the content of the external storage apparatus, and therefore the RAM 2020, the external apparatus, and the like in the present embodiment are referred to as a memory, a storage section, and a storage apparatus. The variety of information in the present embodiment, such as the variety of programs, data, tables, databases, and the like are stored on the storage apparatus to become the target of the information processing. The CPU 2000 can hold a portion of the RAM 2020 in a cache memory and read from or write to the cache memory. With such a configuration as well, the cache memory serves part of the function of the RAM 2020, and therefore the cache memory is also included with the RAM 2020, the memory, and/or the storage apparatus in the present invention, except when a distinction is made.

The CPU 2000 executes the various processes such as the computation, information processing, condition judgment, searching for/replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or acquires a subroutine.

The CPU 2000 can search for information stored in a file in the storage apparatus, the database, and the like. For example, if a plurality of entries associated respectively with a first type of value and a second type of value are stored in the storage apparatus, the CPU 2000 can search for entries fulfilling a condition designated by the first type of value from among the plurality of entries stored in the storage apparatus. The CPU 2000 can then obtain the second type of value associated with the first type of value fulfilling the prescribed condition by reading the second type of value stored at the same entry.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus, a calibration method, a program, and a recording medium that can correct a difference between response times of a comparator.

What is claimed is:

1. A test apparatus that tests a device under test, comprising:
   a driver that outputs a signal to a transmission line that is to be connected to the device under test;
   a comparator that compares a level of the signal transmitted on the transmission line to a set reference level;
   a judging section that judges acceptability of the device under test based on a measurement result, obtained by the comparator, of a response signal from the device under test; and
   a response characteristic detecting section that, with an end of the transmission line on the device under test side connected to a prescribed potential, sequentially outputs a rising waveform and a falling waveform from the driver, and that detects a difference between a response time of the comparator for the rising waveform and a response time of the comparator for the falling waveform, based on measurement results, obtained by the comparator, of the waveforms and corresponding reflected waveforms, wherein the response characteristic detecting section calculates a difference between output characteristics of the rising waveform and the falling waveform output from the driver, based on the measurement results from the comparator of the waveforms and the corresponding reflected waveforms, and corrects a difference between the response times of the comparator based on the difference between the output characteristics.

2. The test apparatus according to claim 1, wherein when detecting the difference between the response time of the comparator for the rising waveform and the response time of the comparator for the falling waveform, the end of the transmission line on the device under test side is grounded.

3. The test apparatus according to claim 2, wherein the response characteristic detecting section sequentially sets at least two reference levels for the comparator for each of the waveforms output by the driver and corresponding reflected waveforms.

4. The test apparatus according to claim 3, wherein the response characteristic detecting section calculates slopes of the waveforms and the corresponding reflected waveforms input to the comparator, based on the measurement results from the comparator.

5. The test apparatus according to claim 4, wherein the response characteristic detecting section detects the difference between the response time of the comparator for the rising waveform and the response time of the comparator for the falling waveform, based on a first measurement time and a second measurement time, and corrects the difference between the response times based on the slopes of the waveforms and the corresponding reflected waveforms input to the comparator,
   the first measurement time is from when the comparator measures the rising waveform to when the comparator measures the reflected waveform of the rising waveform, and
   the second measurement time is from when the comparator measures the falling waveform to when the comparator measures the reflected waveform of the falling waveform.

6. The test apparatus according to claim 5, further comprising a response characteristic adjusting section that adjusts a response characteristic of the comparator based on the difference between the response times detected by the response characteristic detecting section.

7. The test apparatus according to claim 5, wherein
the comparator compares a level of a waveform input to the comparator to the reference level, at timings of a strobe signal having a prescribed period, and
the response characteristic detecting section adjusts the reference level such that a timing at which the level of the waveform input to the comparator matches the reference level is substantially the same as the timing of the strobe signal.

8. A method for calibrating a test apparatus that tests a device under test, comprising:
providing the test apparatus with:
a driver that outputs a signal to a transmission line that is to be connected to the device under test;
a comparator that compares a level of the signal transmitted on the transmission line to a set reference level; and
a judging section that judges acceptability of the device under test based on a measurement result, obtained by the comparator, of a response signal from the device under test; and
when (i) sequentially outputting a rising waveform and a falling waveform from the driver, with an end of the transmission line on the device under test side connected to a prescribed potential, and detecting a difference between a response time of the comparator for the rising waveform and a response time of the comparator for the falling waveform, based on measurement results, obtained by the comparator, of the waveforms and corresponding reflected waveforms, (ii) calculating a difference between output characteristics of the rising waveform and the falling waveform output from the driver, based on the measurement results from the comparator of the waveforms and the corresponding reflected waveforms, and correcting a difference between the response times of the comparator based on the difference between the output characteristics.

9. A recording medium storing a program causing a computer to function as a calibration apparatus that calibrates a test apparatus for testing a device under test, wherein
the test apparatus includes:
a driver that outputs a signal to a transmission line that is to be connected to the device under test;
a comparator that compares a level of the signal transmitted on the transmission line to a set reference level; and
a judging section that judges acceptability of the device under test based on a measurement result, obtained by the comparator, of a response signal from the device under test,
the program causes the computer to function as a response characteristic detecting section that, with an end of the transmission line on the device under test side connected to a prescribed potential, sequentially outputs a rising waveform and a falling waveform from the driver, and that detects a difference between a response time of the comparator for the rising waveform and a response time of the comparator for the falling waveform, based on measurement results, obtained by the comparator, of the waveforms and corresponding reflected waveforms, and
the program causes the response characteristic detecting section to calculate a difference between output characteristics of the rising waveform and the falling waveform output from the driver, based on the measurement results from the comparator of the waveforms and the corresponding reflected waveforms, and to correct a difference between the response times of the comparator based on the difference between the output characteristics.

* * * * *